(12) United States Patent
Dyer et al.

(10) Patent No.: US 7,790,542 B2
(45) Date of Patent: Sep. 7, 2010

(54) CMOS DEVICES HAVING REDUCED THRESHOLD VOLTAGE VARIATIONS AND METHODS OF MANUFACTURE THEREOF

(75) Inventors: Thomas Walter Dyer, Pleasant Valley, NY (US); Haining Sam Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 230 days.

(21) Appl. No.: 12/141,314

(22) Filed: Jun. 18, 2008

(65) Prior Publication Data

US 2009/0315117 A1    Dec. 24, 2009

(51) Int. Cl.
     *H01L 21/336*      (2006.01)
(52) U.S. Cl. ............... 438/199; 438/587; 257/E21.206; 257/E27.062
(58) Field of Classification Search ................. 438/199, 438/587; 257/E21.206, E27.062
See application file for complete search history.

(56) References Cited

U.S. PATENT DOCUMENTS

| | | | | |
|---|---|---|---|---|
| 5,918,132 | A * | 6/1999 | Qian et al. ................. | 438/299 |
| 6,001,695 | A | 12/1999 | Wu | |
| 6,287,953 | B1 * | 9/2001 | Sander et al. ............... | 438/618 |
| 6,586,288 | B2 * | 7/2003 | Kim et al. .................. | 438/183 |
| 6,780,695 | B1 * | 8/2004 | Chen et al. .................. | 438/202 |
| 7,060,580 | B2 * | 6/2006 | Cho et al. ................... | 438/303 |
| 2008/0188052 | A1 * | 8/2008 | Winstead et al. ............ | 438/299 |
| 2009/0095981 | A1 * | 4/2009 | Kang et al. ................. | 257/190 |
| 2009/0298272 | A1 * | 12/2009 | Rhodes ....................... | 438/587 |

* cited by examiner

*Primary Examiner*—George Fourson
(74) *Attorney, Agent, or Firm*—Cantor Colburn LLP; Joseph Petrokaitis

(57) ABSTRACT

Stress enhanced transistor devices and methods of fabricating the same are provided. In one embodiment, a transistor device comprises: a gate conductor disposed above a semiconductor substrate between a pair of dielectric spacers, wherein the semiconductor substrate comprises a channel region underneath the gate conductor and recessed regions on opposite sides of the channel region, wherein the recessed regions undercut the dielectric spacers to form undercut areas of the channel region; and epitaxial source and drain regions disposed in the recessed regions of the semiconductor substrate and extending laterally underneath the dielectric spacers into the undercut areas of the channel region.

11 Claims, 15 Drawing Sheets

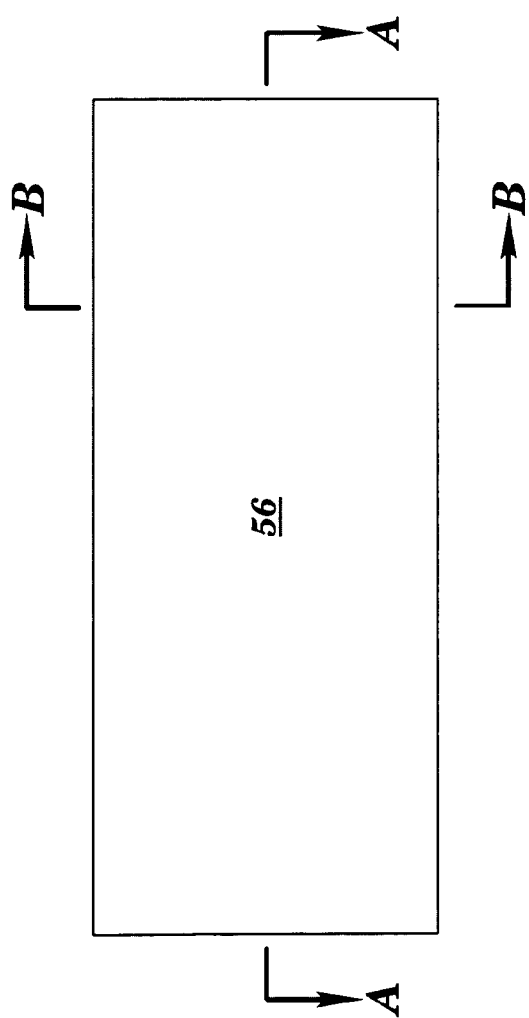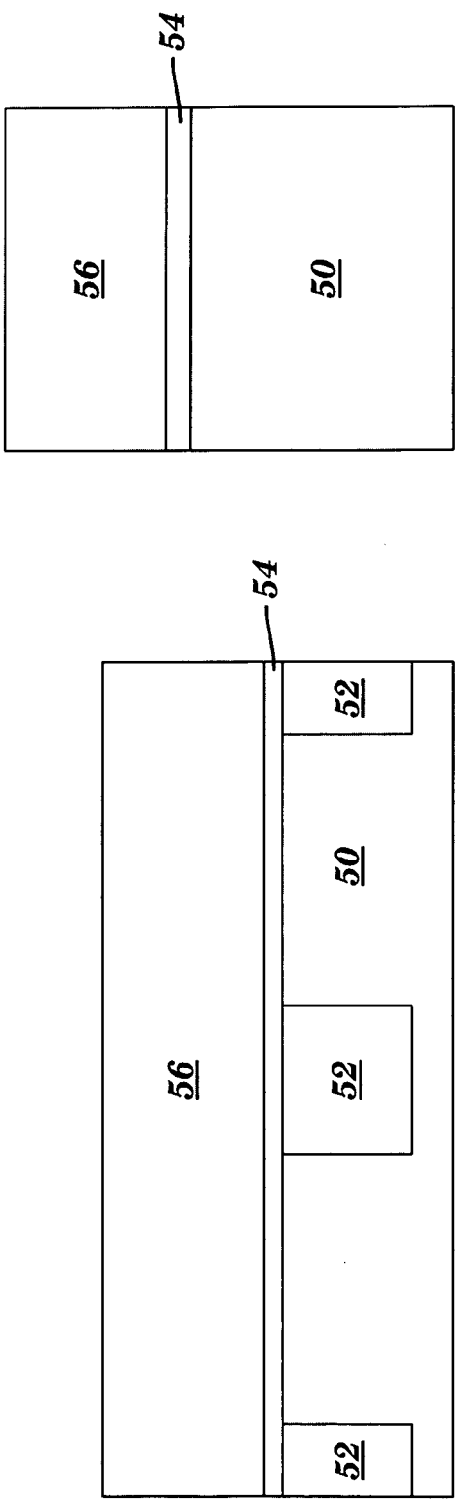
FIG. 4
FIG. 5
FIG. 6

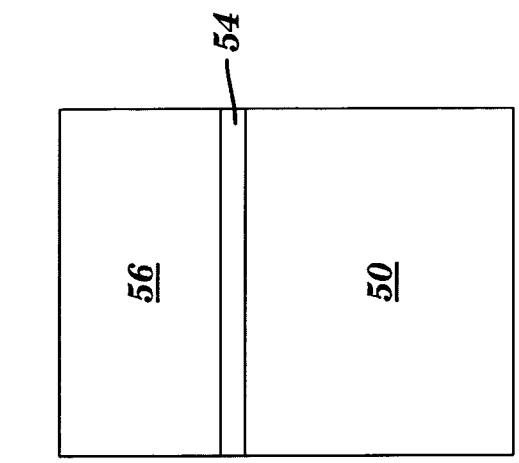
FIG. 9
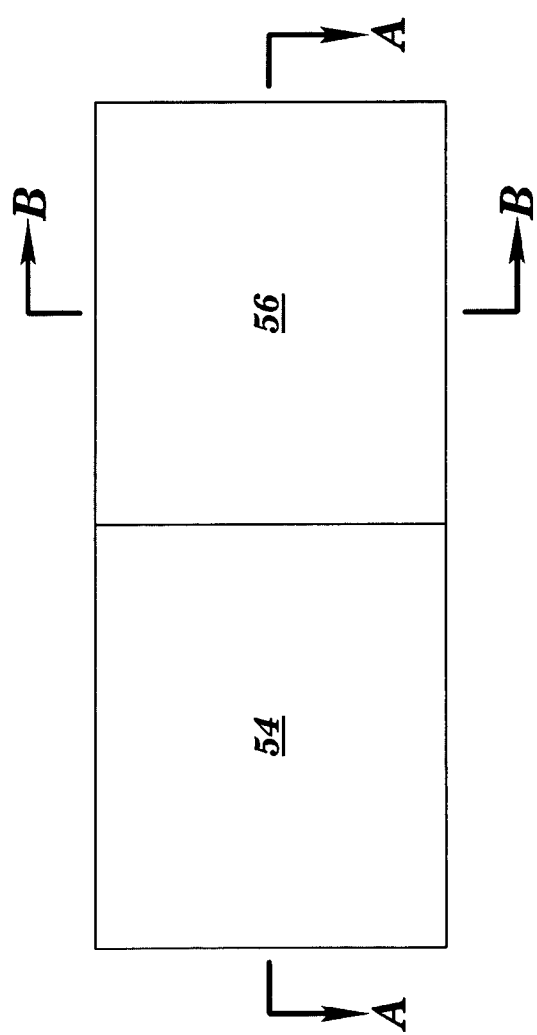
FIG. 7
FIG. 8

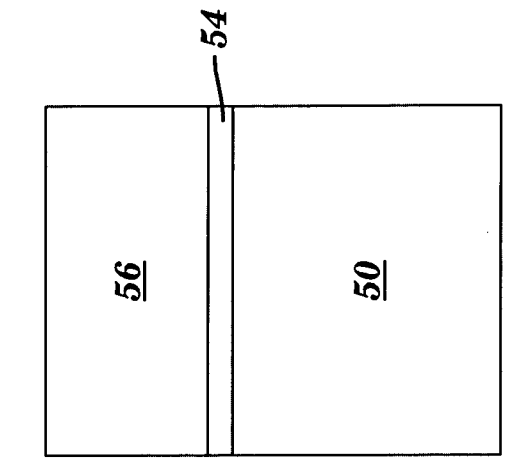
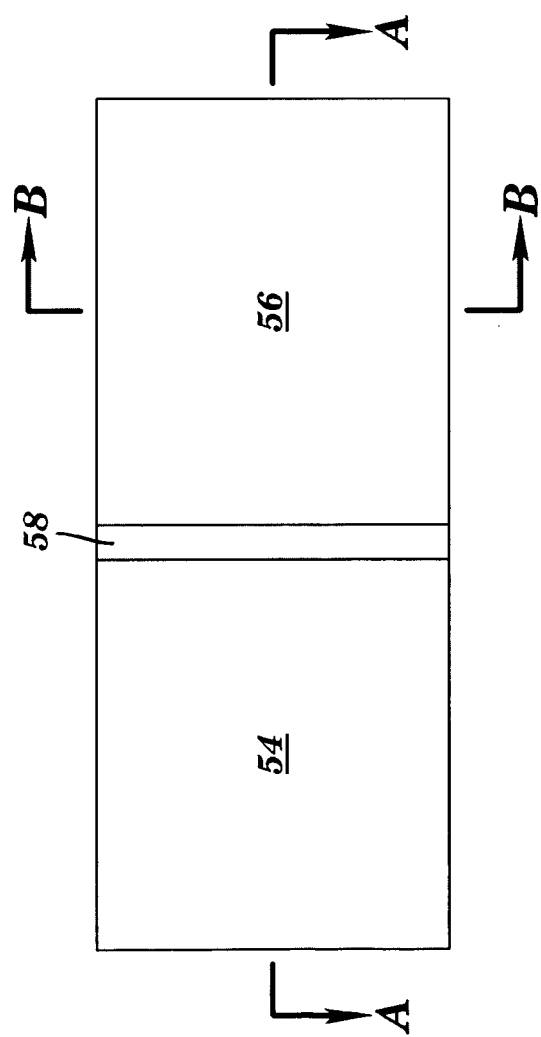
FIG. 10
FIG. 11
FIG. 12

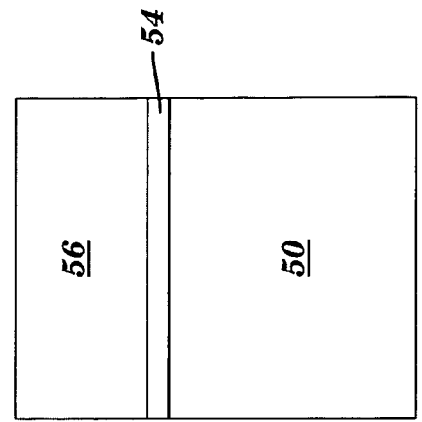
FIG. 18
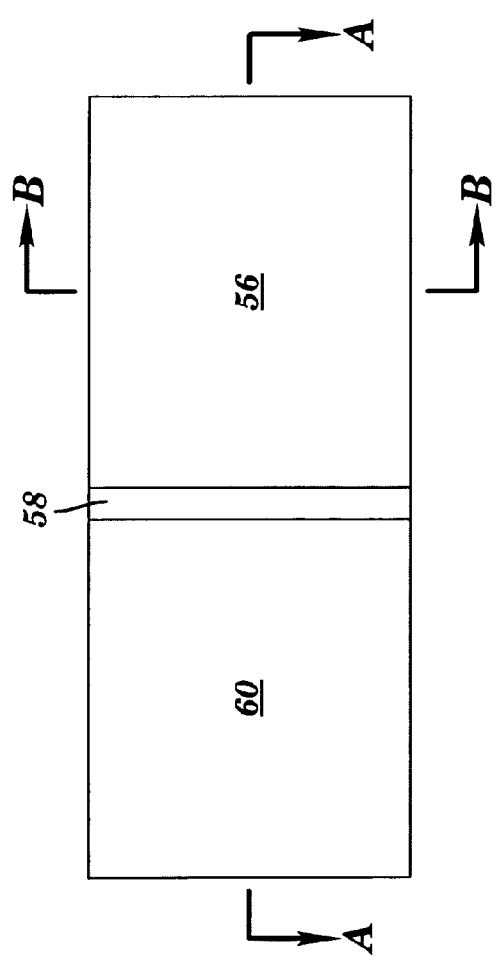
FIG. 16
FIG. 17

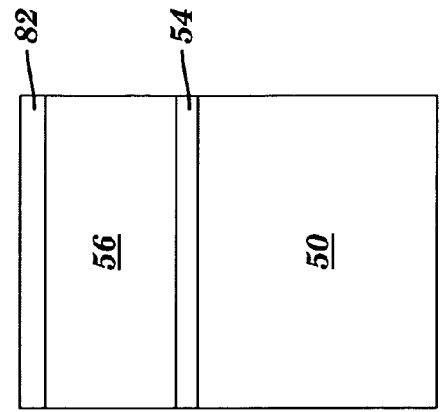
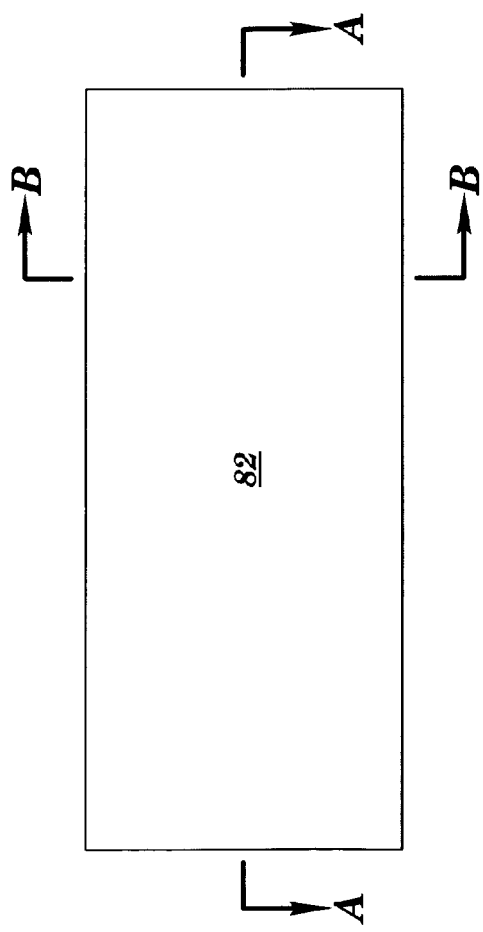
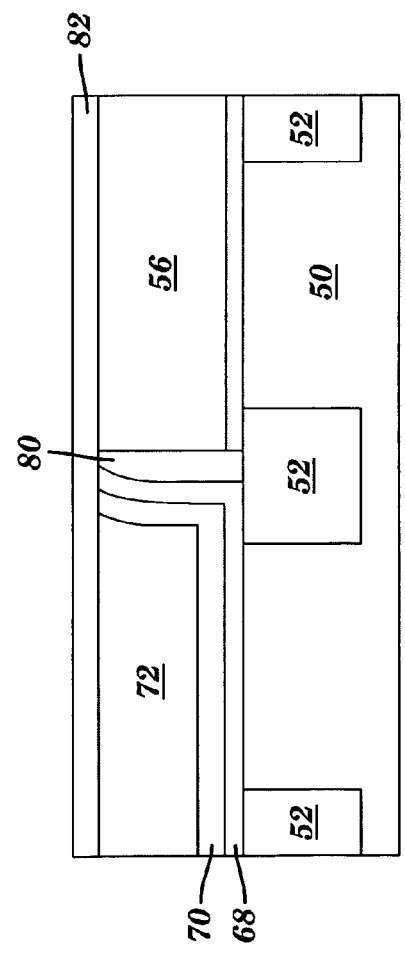

CMOS DEVICES HAVING REDUCED THRESHOLD VOLTAGE VARIATIONS AND METHODS OF MANUFACTURE THEREOF

BACKGROUND OF THE INVENTION

1. Field of the Invention

This invention relates to semiconductor fabrication, and particularly to fabricating CMOS transistor devices with an air gap between the N-type and P-type doped regions of a gate electrode for reducing threshold voltage variations that can be caused by dopant cross-diffusion.

2. Description of Background

Integrated circuits often employ active devices known as transistors such as field effect transistors (FETs). A metal-on-semiconductor field effect transistor (MOSFET) includes a silicon-based substrate comprising a pair of impurity regions, i.e., source and drain junctions, spaced apart by a channel region. A gate electrode is dielectrically spaced above the channel region of the silicon-based substrate. The junctions can comprise dopants which are opposite in type to the dopants residing within the channel region. MOSFETs comprising n-type doped junctions are referred to as NFETs, and MOSFETs comprising p-type doped junctions are referred to as PFETs. The gate electrode can comprise a doped semiconductive material such as polycrystalline silicon (polysilicon). The gate electrode can serve as a mask for the channel region during the implantation of dopants into the adjacent source and drain junctions. An interlevel dielectric can be disposed across the transistors of an integrated circuit to isolate the gate areas and the junctions. Ohmic contacts can be formed through the interlevel dielectric down to the gate areas and/or junctions to couple them to overlying interconnect lines.

Integrated circuits comprising pairs of NFET and PFET devices are known as complementary metal-oxide-semiconductor (CMOS) circuits. The NFETs and PFETs of a CMOS circuit can be fabricated from a common gate electrode layer by doping a section of the gate electrode belonging to the NFET with n-type dopants and the section of the gate electrode belonging to the PFET with p-type dopants, followed by annealing the dopants for activation. An undoped section is usually located between the NFET and PFET sections of the gate electrode. Demands for increased performance, functionality, and manufacturing economy for integrated circuits have resulted in extreme integration density and scaling of NFETs and PFETs to very small sizes. The spacing distances between adjacent NFET and PFET devices have been scaled accordingly.

Unfortunately, reducing the spacing between NFET and PFET devices sharing a common gate electrode can lead to dopant cross-diffusion between the NFET and PFET sections of the gate electrode. This cross-diffusion can undesirably cause a shift in the work function of one or both of the NFET and PFET devices, resulting in threshold voltage ($V_T$) variations and thus $V_T$ mismatch between those devices. This problem has been observed in 65 nanometer (nm) technology, particularly in static random access memory (SRAM) technology, which includes FETs having $V_{min}$ and stability values that are very sensitive to $V_T$ mismatch. Severe dopant cross-diffusion is expected in 32 nm technology, which has transistor spacing distances equal to about half of the dopant diffusion length.

SUMMARY OF THE INVENTION

The shortcomings of the prior art are overcome and additional advantages are provided through the provision of methods for fabricating NFET and PFET devices that share a common gate electrode with an air gap between the N-type and P-type doped regions of the gate electrode for inhibiting dopant cross-diffusion. In one embodiment, a method of forming an integrated circuit comprising an NFET transistor and a PFET transistor that share a common gate electrode comprises: depositing and patterning a first gate electrode section upon a gate dielectric disposed on a semiconductor substrate; forming a dielectric spacer upon a sidewall surface of the first gate electrode section; depositing a gate electrode material to a level above an upper surface of the first gate electrode section; removing the gate electrode material down to a level substantially coplanar with the upper surface of the first gate electrode section to form a second gate electrode section; and etching the dielectric spacer to form a gap between the first and second gate electrode sections.

In another embodiment, an integrated circuit comprises an NFET transistor and a PFET transistor that share a common gate electrode, wherein the gate electrode comprises an N-type doped region for the NFET transistor, a P-type doped region for the PFET transistor, and an air gap disposed between the N-type doped region and the P-type doped region of the gate electrode for inhibiting dopant cross-diffusion.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 1-27 illustrate one example of the fabrication of NFET and PFET devices sharing a common gate electrode with an air gap between the N-type and P-type doped regions of the gate electrode, wherein FIGS. 1, 4, 7, 10, 13, 16, 19, 22, and 25 depict top plan views of a section of an integrated circuit as it is being fabricated, FIGS. 2, 5, 8, 11, 14, 17, 20, 23, and 26 depict cross-sectional views along lines A-A of the corresponding top plan views, and FIGS. 3, 6, 9, 12, 15, 18, 21, 24, and 27 depict cross-sectional views along lines B-B of the corresponding top plan views; and FIGS. 28-45 illustrate alternative steps to those shown in FIGS. 13-27, wherein FIGS. 28, 31, 34, 37, 40, and 43 depict top plan views of a section of an integrated circuit as it is being fabricated, FIGS. 29, 32, 35, 38, 41, and 44 depict cross-sectional views along lines A-A of the corresponding top plan views, and FIGS. 30, 33, 36, 39, 42, and 45 depict cross-sectional views along lines B-B of the corresponding top plan views.

The detailed description explains the preferred embodiments of the invention, together with advantages and features, by way of example with reference to the drawings.

DETAILED DESCRIPTION OF THE INVENTION

The fabrication of CMOS transistors with an air gap between the N-type and P-type doped regions of a gate electrode shared by the transistors is disclosed herein. This air gap serves to prevent or inhibit the cross-diffusion of dopants between the oppositely doped regions of the gate electrode. In the absence of such cross-diffusion, the distances between adjacent NFET and PFET devices can be reduced without being concerned that $V_T$ variations might occur and undesirably cause $V_T$ mismatch between the NFET and PFET devices. As such, more dense integrated circuits such as SRAM circuits can be formed without compromising the stability of such circuits.

Figure 3:
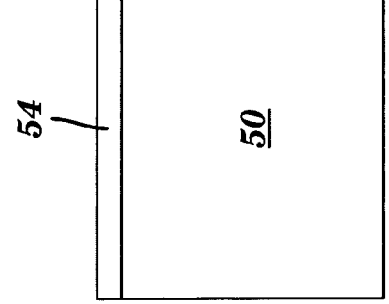
Figure 1:
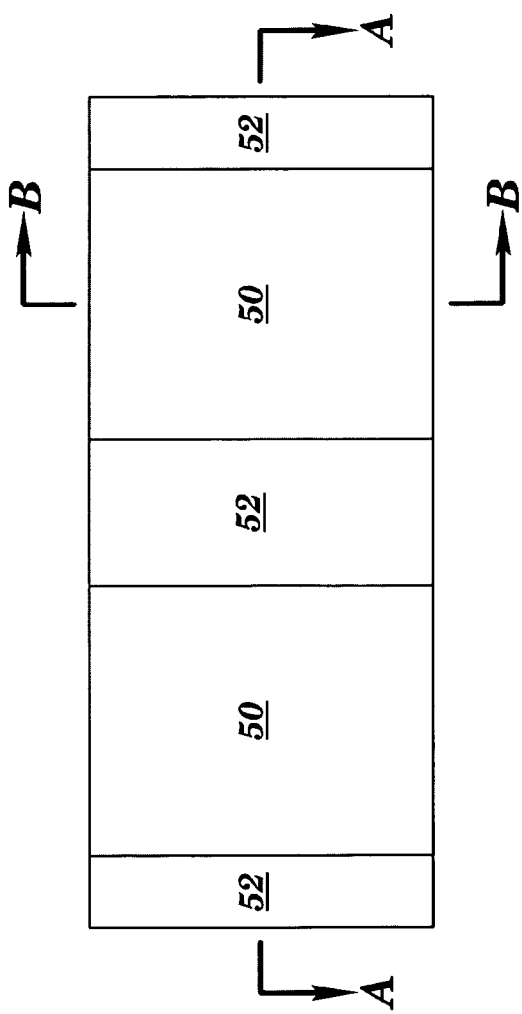
Figure 2:
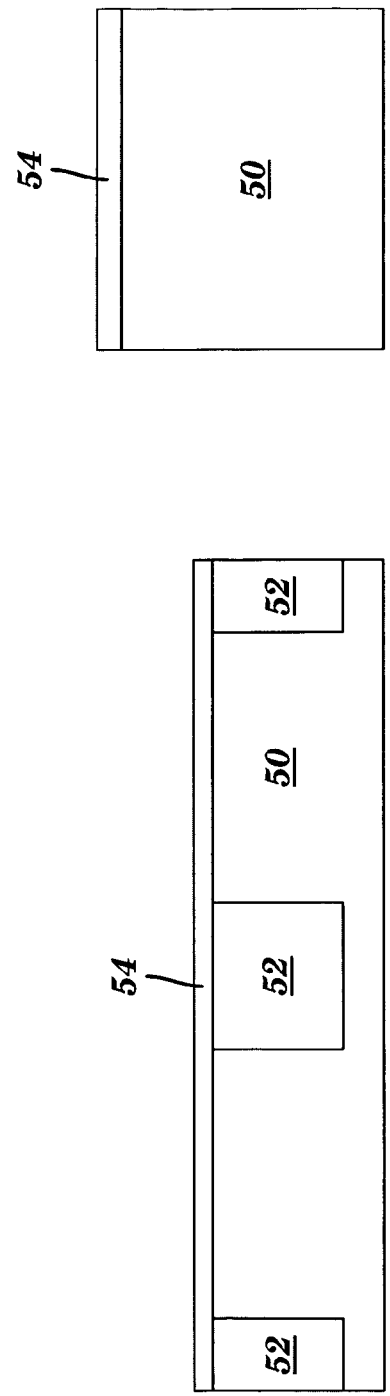

Turning now to the drawings in greater detail, it will be seen that FIGS. 1-27 illustrate an exemplary embodiment of a method for fabricating NFET and PFET devices sharing a common gate electrode with an air gap between oppositely doped regions of the gate electrode. As shown in FIGS. 1-3, a bulk semiconductor substrate 50 comprising single crystalline silicon that has been slightly doped with n-type or p-type dopants is first obtained. Alternatively, a semiconductor layer 50 can be formed upon an insulation layer (not shown) to create a silicon-on-insulator structure. Shallow trench isolation structures 52 can be formed in the semiconductor substrate 50 on opposite sides of ensuing NFET and PFET devices to isolate different active areas of the substrate 50. As shown in FIGS. 5 and 6, a gate dielectric 54 comprising e.g., thermally grown silicon dioxide ($SiO_2$), can be formed across the semiconductor substrate 50.

Subsequently, a gate electrode material 56 comprising, e.g., polysilicon, can be deposited across the gate dielectric 54, as depicted in FIGS. 4-6. Next, the gate electrode material 56 can be patterned using lithography and an anisotropic etch technique, e.g., reactive ion etching (RIE), to form a first gate electrode section 56, as shown in FIGS. 7-9. As shown in FIGS. 10-12, a dielectric spacer 58 comprising a dielectric can then be formed upon the exposed sidewall surface of the first gate electrode section 56 via chemical-vapor deposition (CVD) of the dielectric followed by an RIE process, which etches the dielectric at a faster rate in the vertical direction than in the horizontal direction. The dielectric spacer 58 can comprise, for example, silicon nitride ($Si_3N_4$), $SiO_2$, or a layer of $SiO_2$ under a layer of $Si_3N_4$. The thickness of the dielectric spacer 58 can be about 5 nm to about 50 nm, more specifically about 10 nm to about 25 nm.

Figure 13:
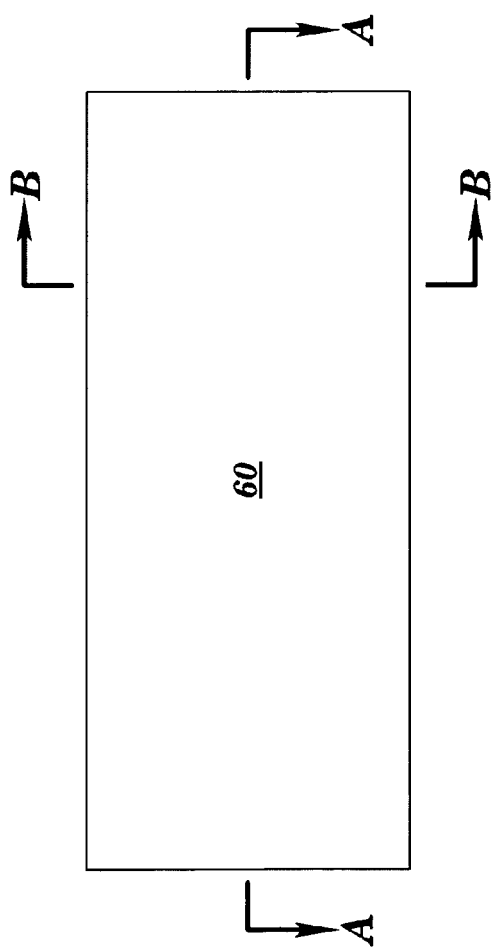
Figure 14:
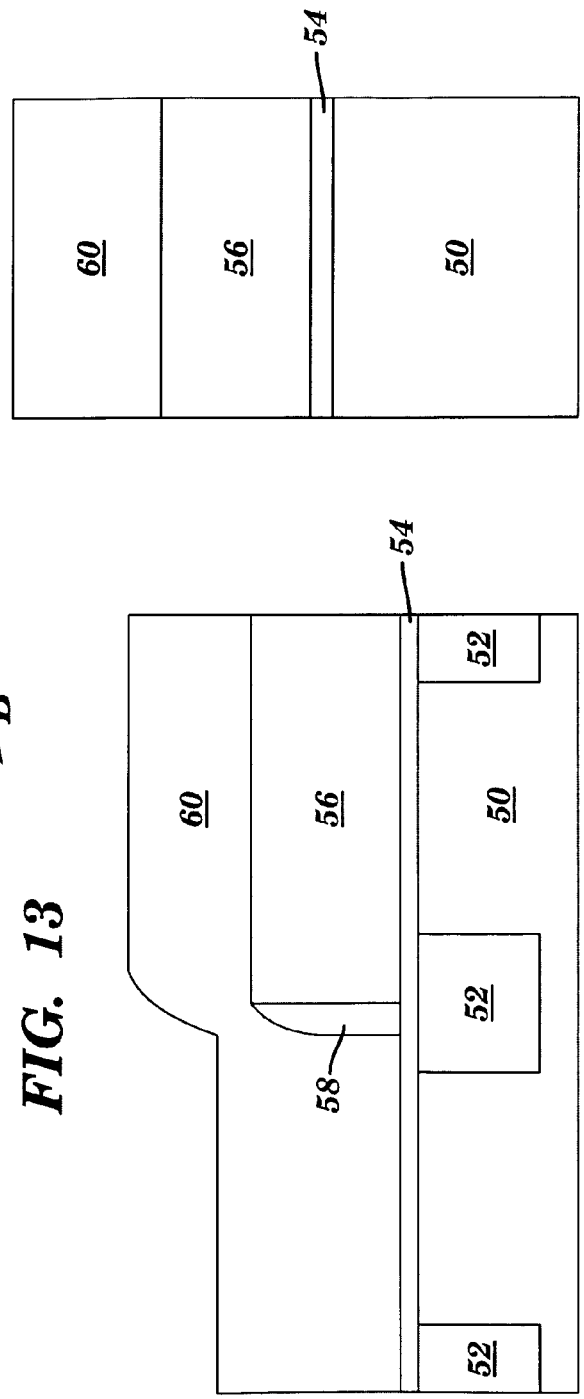
Figure 15:
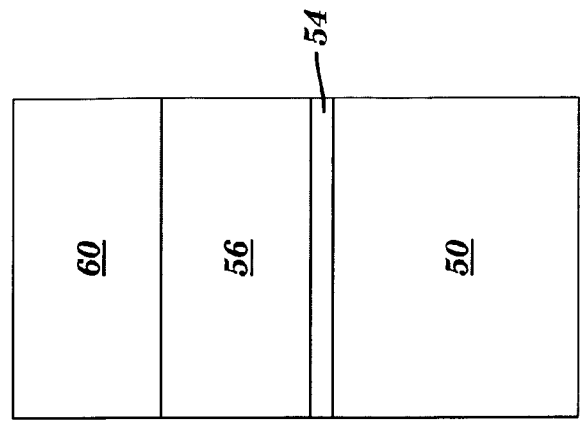

Turning now to FIGS. 13-15, another gate electrode material 60 comprising, e.g., polysilicon, can thereafter be deposited to a level above an upper surface of the first gate electrode section 56. Then, as shown in FIGS. 16-18, the gate electrode material 60 can be removed to a level substantially coplanar with the upper surface of the first gate electrode section 56 to form a second gate electrode section 58. This removal can be performed by subjecting the surface of the gate electrode material 60 to chemical mechanical polishing (CMP).

Figure 19:
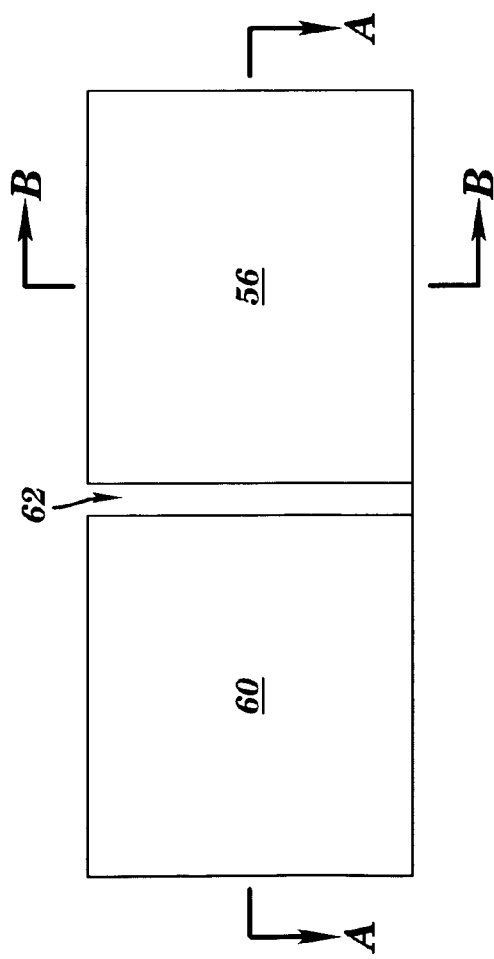
Figure 20:
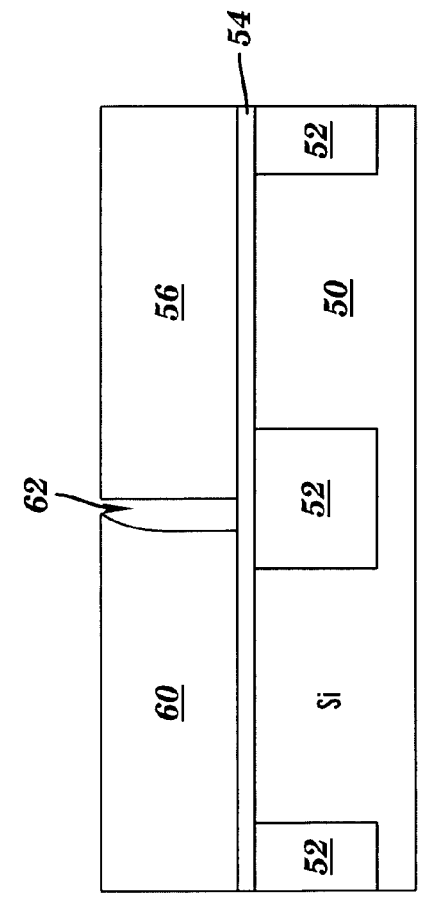
Figure 21:
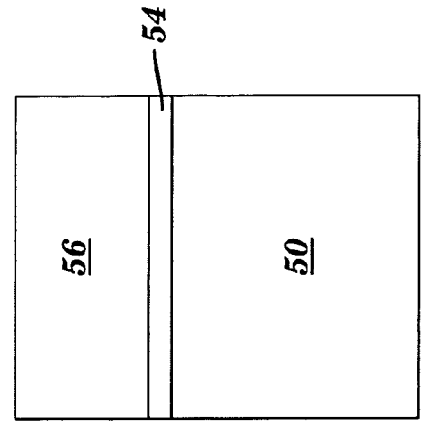

Thereafter, as shown in FIGS. 19-21, the dielectric spacer 58 can be removed using an etch technique selective to the spacer material such as a wet etch chemistry. As a result of the removal of dielectric spacer 58, an air gap 62 is formed between first and second gate electrode sections 56 and 60 to inhibit the cross-diffusion of dopants subsequently implanted in these sections.

Figures 22, 23, 24:
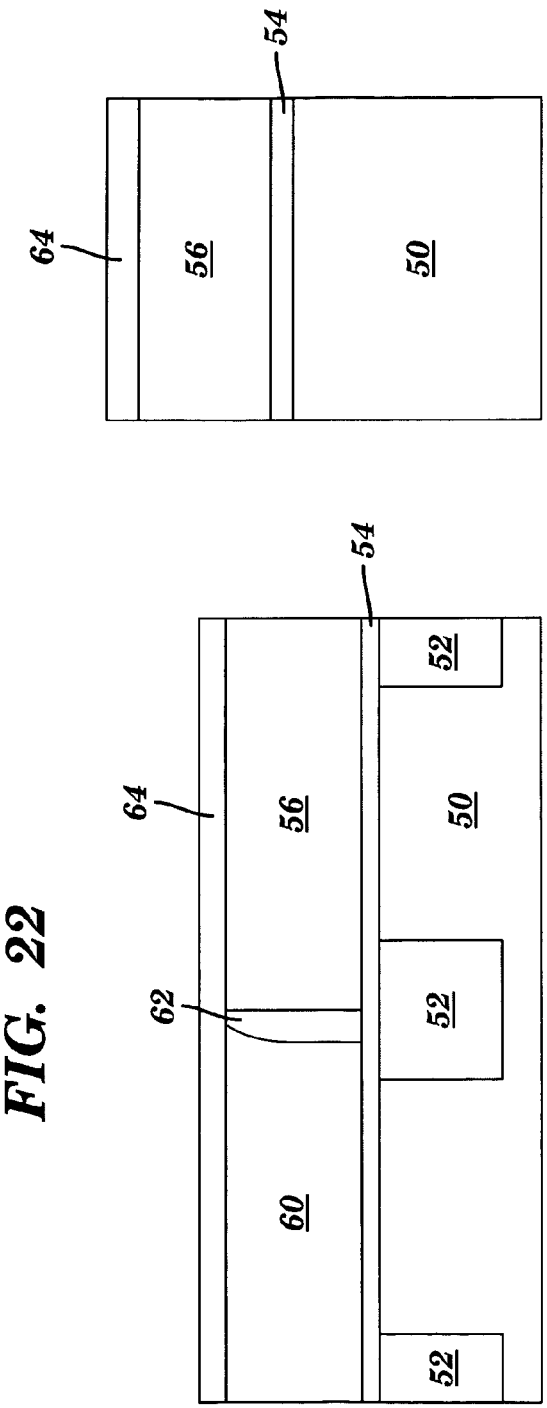
Figure 27:
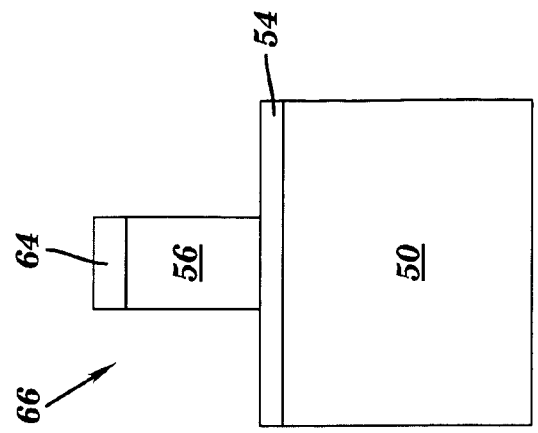
Figure 25:
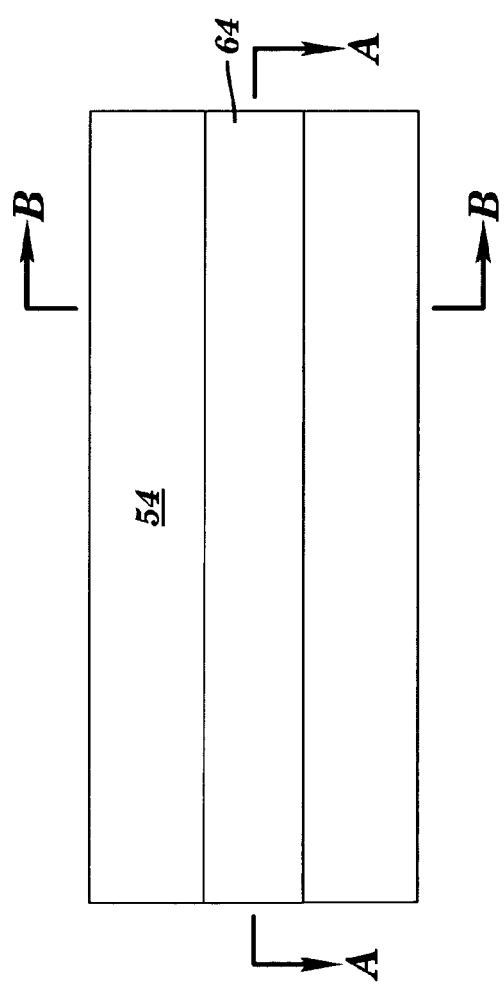
Figure 26:
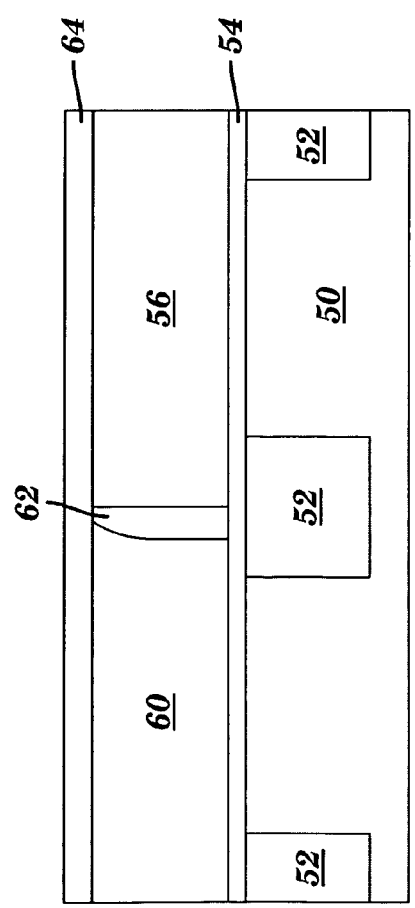

After the formation of air gap 62, NFET and PFET devices can be formed that share a common gate electrode comprising first and second sections 56 and 60 by first depositing a thin capping layer 64, e.g., a silicon nitride layer or a polysilicon layer, across the gate electrode sections 56 and 60, as depicted in FIGS. 22-24. The capping layer 64 and the gate electrode sections 56 and 60 can then be patterned to form gate structures 66 using lithography and an anisotropic technique, as illustrated in FIGS. 25-27. Although not shown, dielectric spacers can subsequently be formed on the opposed sidewall surfaces of the gate structures 66 via CVD of a dielectric followed by an anisotropic etch technique. The capping layer 68 protects the underlying gate electrode sections 56 and 60 from being removed during the formation of the dielectric spacers. Source and drain junctions aligned to the lateral edges of the dielectric spacers can then be formed in semiconductor substrate 50 through the implantation of n-type dopants into the NFET section of the substrate 50 and p-type dopants into the PFET section of the substrate 50 in two separate steps using masks. During these implantation steps, n-type dopants also become implanted into the gate electrode section corresponding to the NFET, and p-type dopants become implanted into the gate electrode section corresponding to the PFET device. Examples of n-type dopants include but are not limited to arsenic, phosphorus, and combinations comprising at least one of the foregoing dopants. Examples of p-type dopants include but are not limited to boron, boron difluoride, and combinations comprising at least one of the foregoing dopants.

Figure 28:
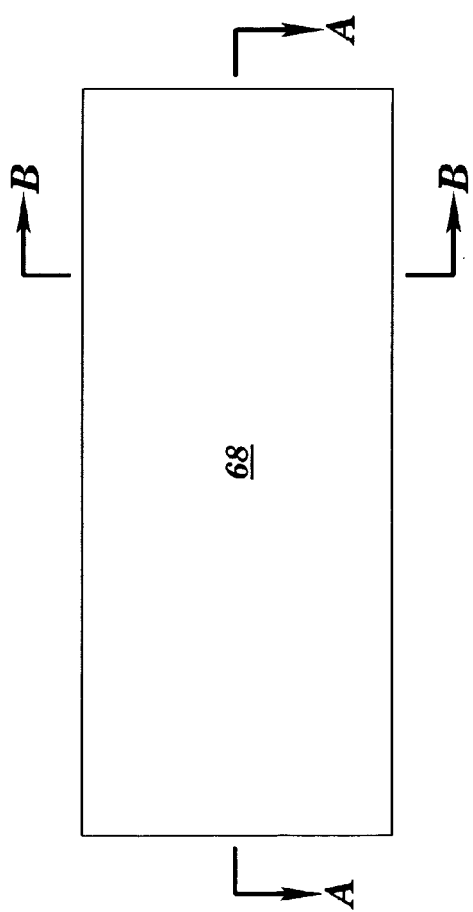
Figure 29:
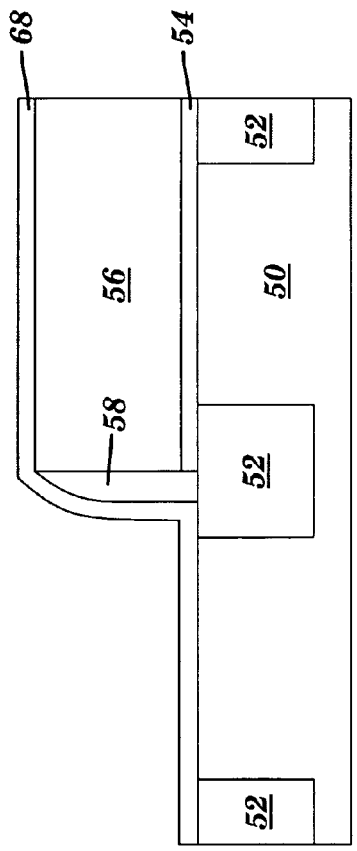
Figure 30:
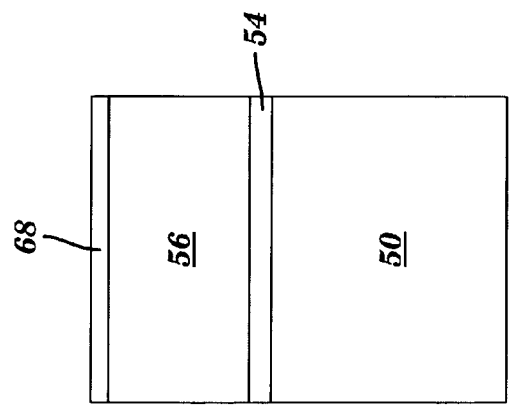

In an alternative embodiment, the fabrication steps depicted in FIGS. 13-27 can be replaced with those depicted in FIGS. 28-45, which illustrate the formation of additional layers laterally adjacent to the first gate electrode section 56. In this embodiment, the gate dielectric 54 can be patterned concurrent with the patterning of the first gate electrode section 56 such that it is only present underneath section 56. As shown in FIGS. 28-30, a high-k dielectric layer 68 can be deposited across the exposed surfaces of the semiconductor substrate 50, the dielectric spacer 58, and the first gate electrode section 56 subsequent to forming the spacer 58 by, e.g., sputter deposition or atomic layer deposition. As used herein, the term "high-k dielectric" refers to dielectrics having a dielectric constant, k, greater than about 4.0, which is higher than the k value of silicon dioxide. Examples of suitable high-k dielectric materials include but are not limited to hafnium oxide ($HfO_3$), hafnium silicon oxynitride (HfSiON), tantalum oxide ($Ta_2O_5$), aluminum oxide ($Al_2O_3$), or combinations comprising at least one of the foregoing dielectrics.

Figure 31:
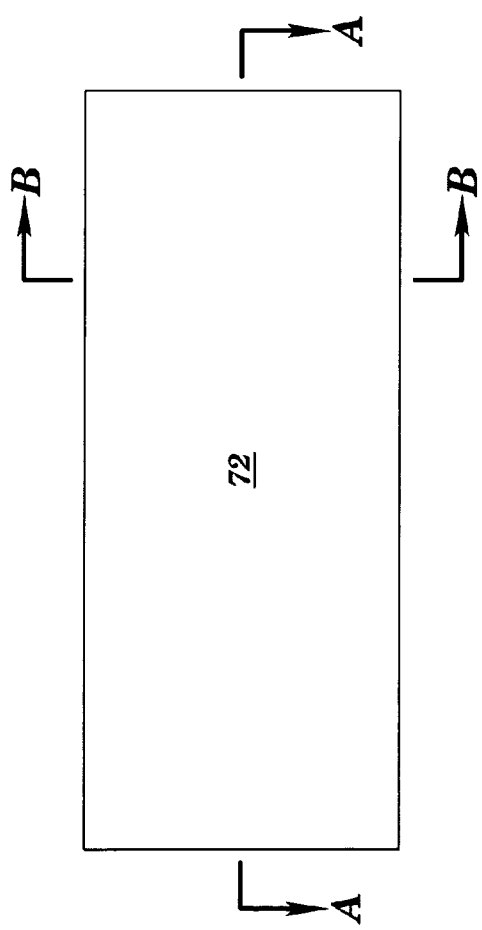
Figure 32:
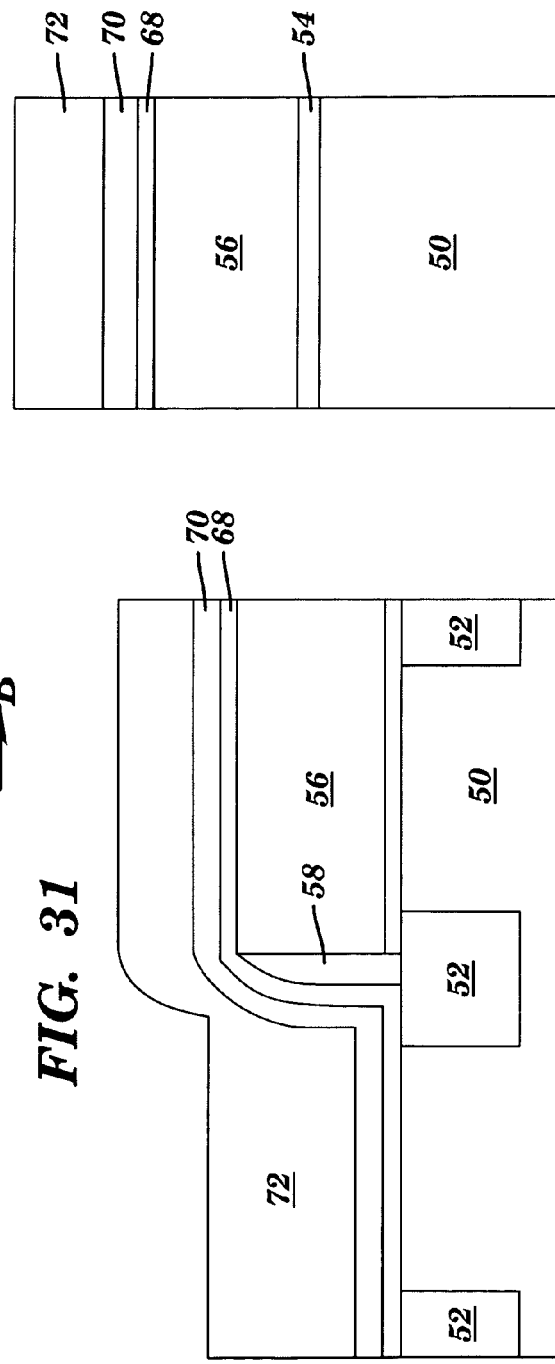
Figure 33:
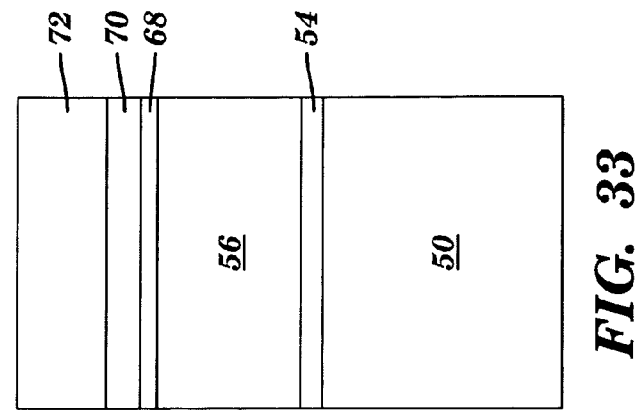
Figure 36:
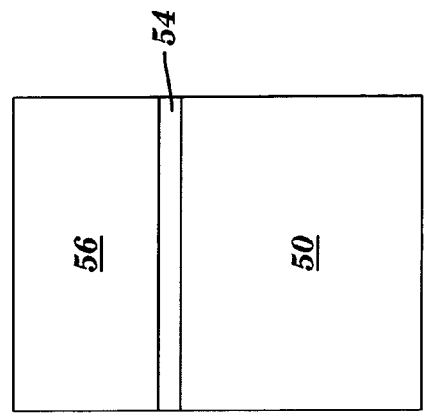
Figure 34:
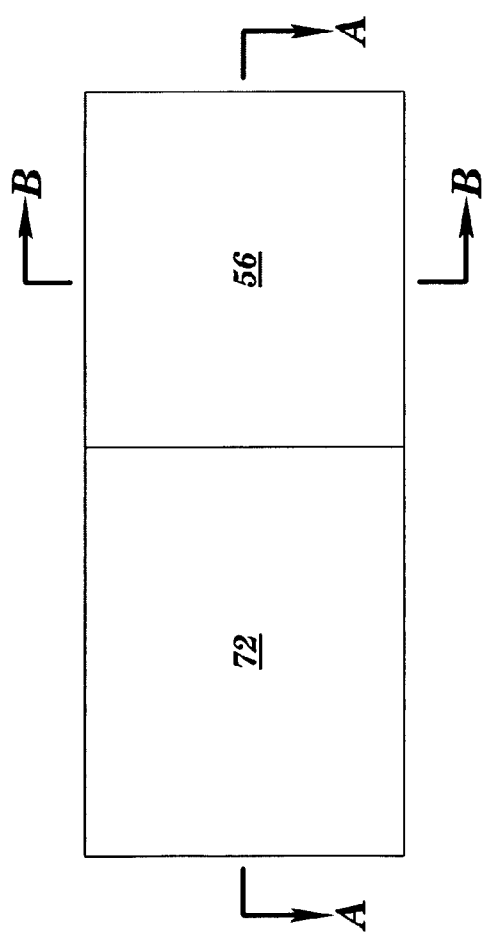
Figure 35:
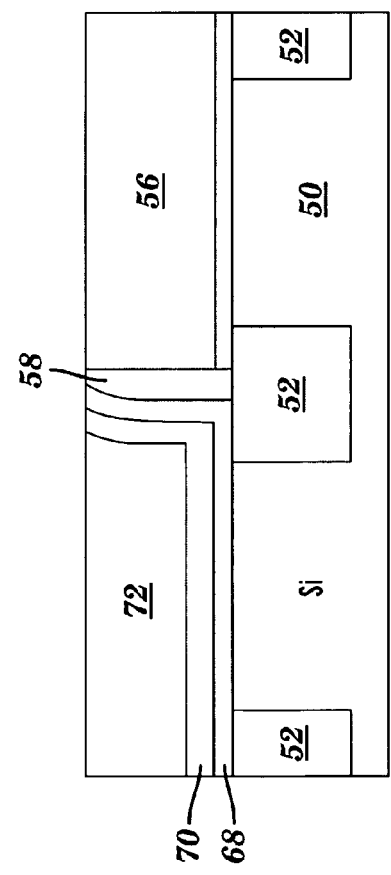

Next, as shown in FIGS. 31-33, a diffusion barrier layer 70 can optionally be deposited across the high-k dielectric layer 68. Examples of suitable diffusion barrier materials include but are not limited to titanium nitride (TiN), tantalum nitride (TaN), tungsten nitride (WN), silicon carbide (SiC), $Si_3N_4$ and combinations comprising at least one of the foregoing materials. Another gate electrode material 72, e.g., polysilicon, can then be deposited across the diffusion barrier layer 70, as shown in FIGS. 31-33. The gate electrode material 72, diffusion barrier layer 70, and high-k-dielectric layer 68 can then be removed down to a level substantially coplanar with the upper surface of the first gate electrode section 56 using, e.g., CMP, as depicted FIGS. 34-36. In this manner, a second gate electrode section 72 is formed upon a gate dielectric comprising the high-k dielectric layer 68.

Figure 39:
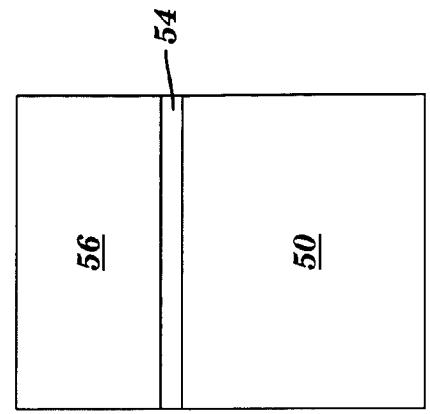
Figure 37:
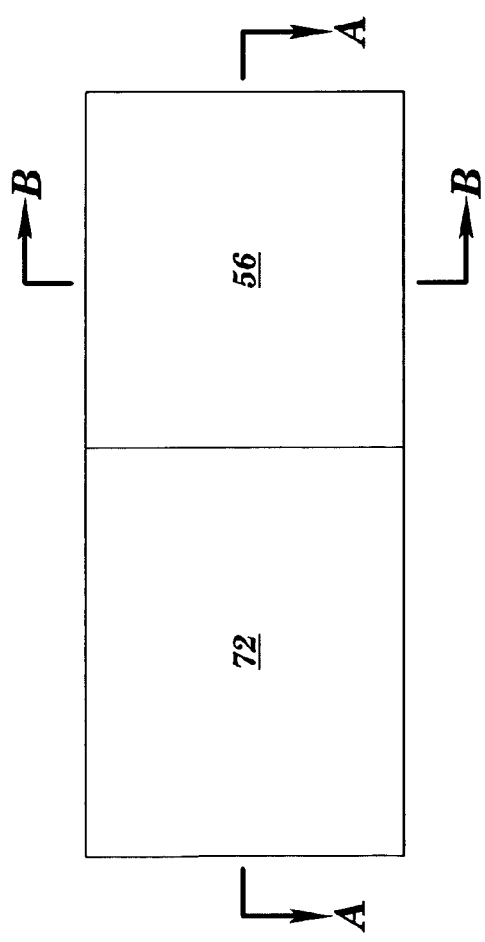
Figure 38:
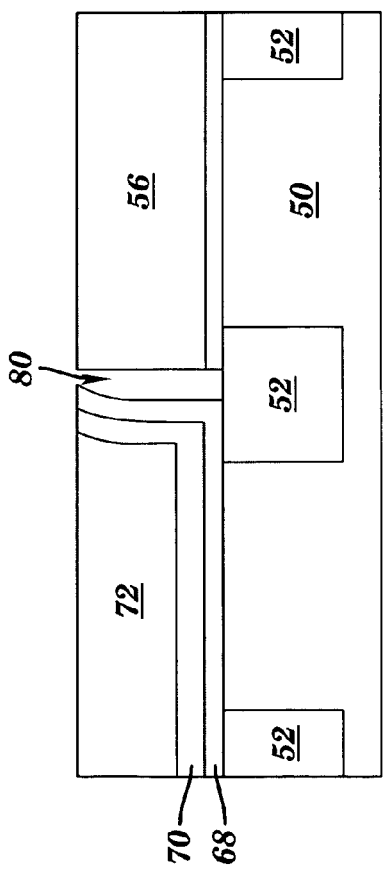
Figure 43:
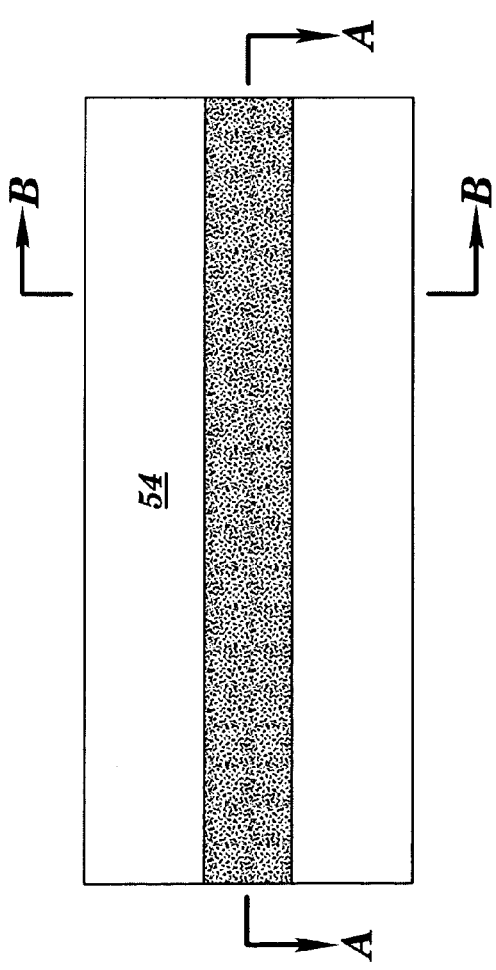
Figure 44:
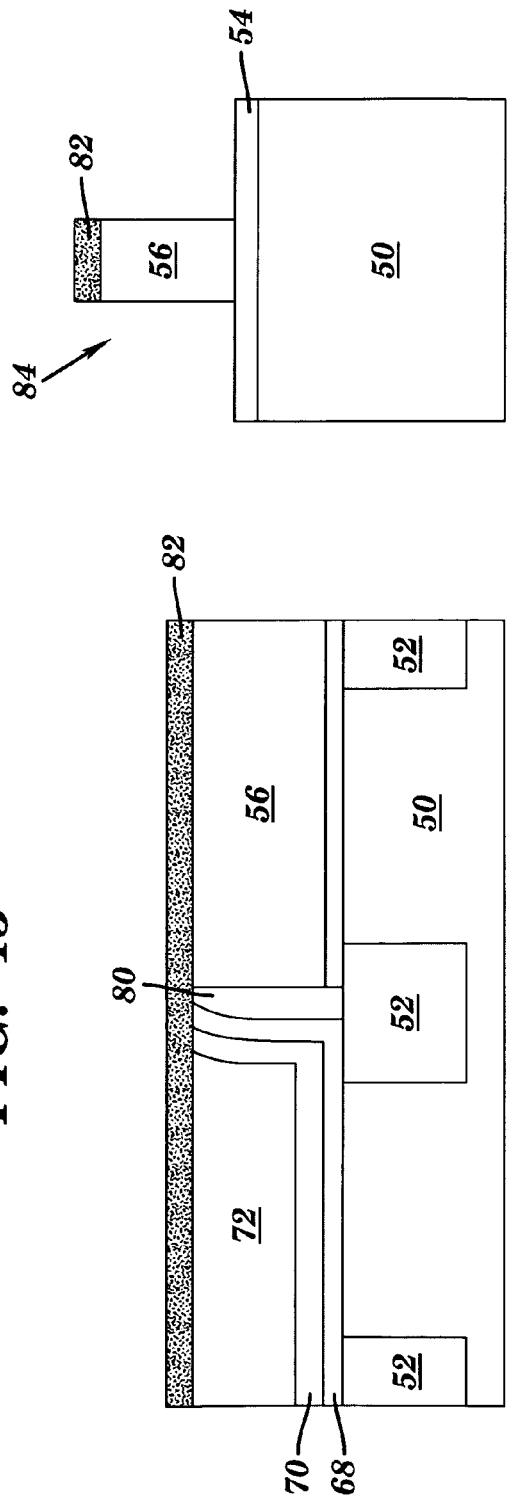
Figure 45:
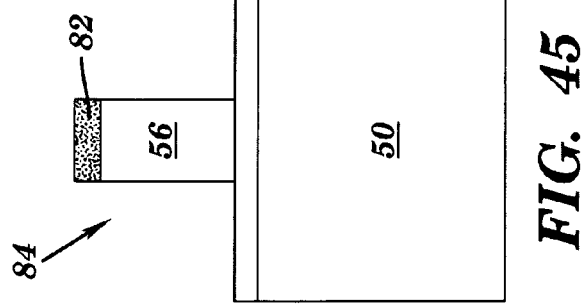

Subsequently, as shown in FIGS. 37-39, the dielectric spacer 58 can be removed using an etch technique selective to the spacer material such as a wet etch chemistry. An air gap 80 is thus formed between first and second gate electrode sections 56 and 72 to inhibit the cross-diffusion of dopants subsequently implanted in these sections. In this embodiment, the diffusion barrier layer 70 can also block the cross-diffusion of dopants. Thereafter, as shown in FIGS. 40-42, a capping layer 82 can be deposited across the first and second gate electrode sections 56 and 72. NFET and PFET transistors can then be formed that share a common gate electrode comprising gate electrode sections 56 and 72 in the same manner as described in the previous embodiment.

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 wt % to about 20 wt %," is inclusive of the endpoints and all intermediate values of the range of about 5 wt % to about 20 wt %). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of forming an integrated circuit comprising an NFET transistor and a PFET transistor that share a common gate electrode, said method comprising:

depositing and patterning a first gate electrode section upon a gate dielectric disposed on a semiconductor substrate;

forming a dielectric spacer upon a sidewall surface of the first gate electrode section;

depositing a gate electrode material to a level above an upper surface of the first gate electrode section;

removing the gate electrode material down to a level substantially coplanar with the upper surface of the first gate electrode section to form a second gate electrode section; and etching the dielectric spacer to form a gap between the first and second gate electrode sections.

2. The method of claim 1, wherein the dielectric spacer comprises silicon nitride and the first and second gate electrode sections comprise polysilicon.

3. The method of claim 1, further comprising patterning the first and second gate electrode sections to form first and second gate electrodes, forming first and second dielectric spacers upon sidewall surfaces of the respective first and second gate electrodes, implanting n-type dopants into the first gate electrode and first source and drain regions on opposite sides of the first dielectric spacers, and implanting p-type dopants into the second gate electrode and second source and drain regions on opposite sides of the second dielectric spacers.

4. The method of claim 3, further comprising depositing a capping layer across the first and second gate electrode sections prior to said patterning the first and second gate electrode sections.

5. The method of claim 1, wherein the gate dielectric is patterned concurrent with said patterning the first gate electrode section.

6. The method of claim 5, further comprising depositing a high-k dielectric layer across exposed surfaces of the semiconductor substrate, the dielectric spacer, and the first gate electrode section subsequent to said forming the dielectric spacer.

7. The method of claim 6, wherein the high-k dielectric layer comprises hafnium oxide, hafnium silicon oxide, tantalum oxide, aluminum oxide, or a combination comprising at least one of the foregoing dielectrics.

8. The method of claim 6, further comprising depositing a diffusion barrier layer across the high-k dielectric layer prior to said depositing the gate electrode material.

9. The method of claim 8, wherein the diffusion barrier layer comprises titanium nitride, tantalum nitride, tungsten nitride, silicon carbide, $Si_3N_4$, or a combination comprising at least one of the foregoing materials.

10. The method of claim 8, further comprising removing the high-k dielectric layer and the diffusion barrier layer from above the first gate electrode section concurrent with said removing the gate electrode material to form the second gate electrode.

11. The method of claim 1, wherein said removing the gate electrode material to the level substantially coplanar with the upper surface of the first gate electrode section comprises chemical-mechanical polishing said gate electrode material.

* * * * *